United States Patent
Chen et al.

(10) Patent No.: US 11,420,287 B2
(45) Date of Patent: Aug. 23, 2022

(54) WIRE CLAMPING SYSTEM FOR FULLY AUTOMATIC WIRE BONDING MACHINE

(71) Applicant: NINGBO SHANGJIN AUTOMATION TECHNOLOGY CO., LTD., Ningbo (CN)

(72) Inventors: Wen Chen, Ningbo (CN); Chengjun Zhang, Ningbo (CN)

(73) Assignee: NINGBO SHANGJIN AUTOMATION TECHNOLOGY CO., LTD., Ningbo (CN)

(*) Notice: Subject to any disclaimer, the term of this patent is extended or adjusted under 35 U.S.C. 154(b) by 12 days.

(21) Appl. No.: 17/035,958

(22) Filed: Sep. 29, 2020

(65) Prior Publication Data
US 2021/0094118 A1   Apr. 1, 2021

(30) Foreign Application Priority Data

Sep. 29, 2019  (CN) .......................... 201910936620.9
Sep. 29, 2019  (CN) .......................... 201921650679.3

(51) Int. Cl.
*B23K 20/00*  (2006.01)
*B23K 20/12*  (2006.01)
*B23K 101/40*  (2006.01)

(52) U.S. Cl.
CPC .......... *B23K 20/005* (2013.01); *B23K 20/125* (2013.01); *B23K 20/126* (2013.01); *B23K 2101/40* (2018.08)

(58) Field of Classification Search
CPC .. B23K 20/004; B23K 20/005; B23K 20/007; B23K 20/125; B23K 20/126;
(Continued)

(56) References Cited

U.S. PATENT DOCUMENTS 3,643,321 A  *  2/1972  Field .................. H01L 24/85
                                                    228/180.5
3,806,019 A  *  4/1974  Diepeveen .......... H01R 43/02
                                                    228/4.5
(Continued)

FOREIGN PATENT DOCUMENTS

JP        57211240 A  * 12/1982  .......... B23K 20/005
JP        58125842 A  *  7/1983  .......... H01L 24/78
(Continued)

OTHER PUBLICATIONS

Machine translation of JP-63240038-A (no date available).*

*Primary Examiner* — Kiley S Stoner

(57) ABSTRACT

A wire clamping system for fully automatic wire bonding machine comprises a base, a wire clamping support, a wire clamping assembly, a driving mechanism and an elastic assembly. The wire clamping assembly can move relative to the capillary, so that when the wire clamping system completes the second bond, the metal wire at the end of the capillary may directly extend out of the capillary by the independent movement of the wire clamping assembly and a length thereof can be effectively controlled, in order to form a metal ball in the next first bond. Furthermore, when the wire clamping system completes the second bond, the wire clamping assembly is in a clamping state, which avoids wires flying, even though the second bond is not firmly connected or the machine vibrates.

13 Claims, 7 Drawing Sheets

(58) Field of Classification Search
CPC ............ B23K 2101/40; B23K 2101/38; B23K 2101/42; H01L 24/45; H01L 2224/451; H01L 2224/78318; H01L 24/78; H01L 2224/78631
USPC ...................................... 228/4.5, 180.5, 904
See application file for complete search history.

(56) References Cited

U.S. PATENT DOCUMENTS

| | | | | |
|---|---|---|---|---|
| 4,475,681 A | * | 10/1984 | Ingle | B23K 20/007 228/4.5 |
| 4,597,522 A | * | 7/1986 | Kobayashi | B23K 20/007 219/56.1 |
| 4,653,681 A | * | 3/1987 | Dreibelbis | B23K 20/005 228/102 |
| 4,746,048 A | * | 5/1988 | Kawaguchi | B23K 3/00 228/5.1 |
| 4,781,319 A | * | 11/1988 | Deubzer | B23K 20/005 228/1.1 |
| 5,014,900 A | * | 5/1991 | Barton | B23K 1/06 228/4.5 |
| 5,031,821 A | * | 7/1991 | Kaneda | H01L 24/03 228/110.1 |
| 5,037,023 A | * | 8/1991 | Akiyama | H01L 24/85 228/102 |
| 5,169,050 A | * | 12/1992 | Montagu | B23K 20/004 228/4.5 |
| 5,176,310 A | * | 1/1993 | Akiyama | H01L 24/85 228/180.5 |
| 5,234,155 A | * | 8/1993 | Takahashi | H01L 24/78 228/179.1 |
| 5,238,173 A | * | 8/1993 | Ura | B23K 20/007 228/104 |
| 5,277,355 A | * | 1/1994 | Weaver | B23K 20/004 228/4.5 |
| 6,282,780 B1 | * | 9/2001 | Waki | H01L 24/78 29/840 |
| 8,459,530 B2 | | 6/2013 | Zhang et al. | |
| 2002/0040920 A1 | * | 4/2002 | Oishi | B23K 20/004 228/4.5 |
| 2002/0063144 A1 | * | 5/2002 | Yamaguchi | H01L 24/78 228/4.5 |
| 2004/0232203 A1 | * | 11/2004 | Gaunekar | B23K 20/004 228/44.3 |
| 2004/0245314 A1 | * | 12/2004 | Vischer | B23K 20/005 228/4.5 |
| 2008/0000946 A1 | * | 1/2008 | Kwan | B23K 20/004 228/4.5 |
| 2008/0083815 A1 | * | 4/2008 | Nachon | H01L 24/78 228/45 |
| 2008/0302857 A1 | * | 12/2008 | Felber | H01L 21/67138 228/47.1 |
| 2014/0034712 A1 | * | 2/2014 | Maeda | B23K 3/08 228/160 |
| 2014/0138426 A1 | * | 5/2014 | Hagiwara | H01L 24/78 228/160 |
| 2015/0243627 A1 | * | 8/2015 | Akiyama | H01L 24/78 228/102 |
| 2015/0249063 A1 | * | 9/2015 | Sekine | H01L 24/85 438/617 |

FOREIGN PATENT DOCUMENTS

| | | | | | |
|---|---|---|---|---|---|
| JP | 58131744 | A | * | 8/1983 | ............ H01L 24/78 |
| JP | 58134435 | A | * | 8/1983 | ............ H01L 24/78 |
| JP | 63240038 | A | * | 10/1988 | ............ H01L 24/78 |
| JP | 04012541 | A | * | 1/1992 | ............ H01L 24/78 |
| JP | 04012544 | A | * | 1/1992 | ............ H01L 24/78 |
| JP | 06244234 | A | * | 9/1994 | ............ H01L 24/78 |
| JP | 09191023 | A | * | 7/1997 | ............ H01L 24/78 |
| JP | 2002368035 | A | * | 12/2002 | ............ H01L 24/78 |

\* cited by examiner

WIRE CLAMPING SYSTEM FOR FULLY AUTOMATIC WIRE BONDING MACHINE

CROSS-REFERENCE TO RELATED APPLICATIONS

This application claims all benefits accruing under 35 U.S.C. § 119 from China Patent Application Nos. 201910936620.9, filed on Sep. 29, 2019, and 201921650679.3, filed on Sep. 29, 2019, in the China National Intellectual Property Administration, the content of which is hereby incorporated by reference.

TECHNICAL FIELD

The present disclosure relates to technical field of wire bonding machine and components thereof, and in particular, to a wire clamping system for a fully automatic wire bonding machine.

BACKGROUND

A fully automatic wire bonding machine including a transducer and a capillary is a device that electrically connects metal wires to semiconductor chips and lead frame using ultrasonic wave under a certain pressure and temperature. The metal wire can be treated by ultrasonic wave through the transducer and the capillary, and a part of the metal wire will be fused on an upper surface of the chip or the lead frame, thereby achieving a firm electrical connection between the chip and the lead frame. Specifically, a first bond of the wire bonding machine is in a spherical shape and a second bond thereof is wedge-shaped. During operation, the wire bonding machine burns an end of the metal wire on the capillary tip into a metal ball by using a high voltage firing device, condenses the metal ball at the end of the metal wire and then bonds the metal ball to the first bond, and moves the capillary and the metal wire to a position of the second bond for next bonding. A wire loop is formed between the first bond and the second bond.

In a traditional wire clamping system for a fully automatic wire bonding machine, the wire clamping assembly is open during creating a little piece of metal wire as a tail. The metal wire may have a tendency to retract, and the metal wire outside of the capillary may be pulled towards the wire clamping assembly accordingly. In addition, the traditional wire clamping system for the fully automatic wire bonding machine may vibrate. It is also possible to pull off the metal wire on the second bond under the second bond with the metal wires not totally welded together, resulting in the metal wire may fly and needs to be re-threaded. Thus, the working efficiency for the fully automatic wire bonding machine is reduced and burden of the worker may be increased.

SUMMARY

According to various embodiments provided by the present disclosure, a wire clamping system for a fully automatic wire bonding machine is provided.

The wire clamping system for the fully automatic wire bonding machine can include:

a base;

a wire clamping support at an end of the base;

a wire clamping assembly configured for clamping a metal wire and pivotally connected to the wire clamping support;

a capillary capable of cutting off or thinning the metal wire;

a driving mechanism configured for driving the wire clamping assembly to rotate independently, the wire clamping assembly comprises a wire clamping and loosening element arranged opposite to the capillary and configured for clamping and loosening the metal wire, a direction from the wire clamping and loosening element to the capillary is defined as a Z-direction, and the wire clamping assembly can rotate relative to the base driven by the driving mechanism to change a distance between the wire clamping and loosening element and the capillary along the Z-direction, so that the metal wire can extend outside of the capillary; and an elastic assembly configured for resetting the wire clamping assembly, wherein one end of the elastic assembly is connected to one end of the wire clamping assembly away from the wire clamping and loosening element, and another end of the elastic assembly is connected to another end of the base away from the wire clamping support.

In the wire clamping system for the fully automatic wire bonding machine, the wire clamping assembly can move relative to the capillary, so that when the wire clamping system for the fully automatic wire bonding machine completes the second bond, the metal wire at the end of the capillary may directly be reserved as a tail by the independent movement of the wire clamping assembly. That is, when the metal wire at the end of the capillary is reserved as the tail, the capillary will not move along the Z-direction. A length of the tail of the metal wire at the end of the capillary can be effectively controlled, in order to form another metal ball in the next first bond. Furthermore, when the wire clamping system for the fully automatic wire bonding machine completes the second bond, the wire clamping assembly is in a clamping state, which avoids wires flying, even though the second bond is not connected to the metal wire firmly towards the capillary or the fully automatic wire bonding machine vibrates. Therefore, the working efficiency of the fully automatic wire bonding machine can be improved.

In some embodiments, the wire clamping assembly comprises a wire clamping main body and a connecting plate connected to the wire clamping main body, and the wire clamping and loosening element is located at one end of the wire clamping main body.

In some embodiments, the driving mechanism comprises a piezoelectric motor, a first wedge block and a second wedge block, wherein the first wedge block and the second wedge block are disposed between the connecting plate and the piezoelectric motor, the first wedge block is fixedly connected to the piezoelectric motor, the second wedge block is fixedly connected to the connecting plate, and the first wedge block and the second wedge block can decrease or eliminate a gap between the piezoelectric motor and the connecting plate. This is an example of the driving mechanism for a user to select conveniently, so as to ensure that the metal wire located between the chip and the lead frame can stably connect these two elements.

In some embodiments, both the first wedge block and the second wedge block have a right-angle trapezoid shape, the first wedge block has a first inclined surface, the second wedge block has a second inclined surface, the first wedge block can move towards the second wedge block when driven by the piezoelectric motor, resulting in the first inclined surface is in contact with the second inclined surface, the first wedge block has a first edge and a second edge parallel to each other, a length of the first edge is shorter than that of the second edge and the first edge is disposed close to the wire clamping assembly. In this way, if the first wedge block moves towards the second wedge block, the first inclined surface and the second inclined surface can be fitted together, then the second wedge block will move along the Z-direction, thereby the wire clamping assembly will rotate.

In some embodiments, the wire clamping system further comprises a transducer connected to the base by a transducer seat and the capillary is disposed on one end of the transducer away from the base.

In some embodiments, the connecting plate is made of metal.

In some embodiments, the driving mechanism can comprise a solenoid and a stator, the stator is arranged on the base and around the solenoid, and the solenoid can drive the connecting plate to move, resulting in that the wire clamping assembly rotates relative to the base. This is another example of the driving mechanism for a user to select conveniently, so as to ensure that the metal wire located between the chip and the lead frame lead frame can stably connect the chip and the lead frame.

In some embodiments, the driving mechanism can comprise a coil, a plurality of magnets are located around an outer periphery of the coil, and the plurality of magnets can drive the connecting plate to move, resulting in that the wire clamping assembly rotates relative to the base. This is another example of the driving mechanism for a user to select conveniently, so as to ensure that the metal wire located between the chip and the lead frame lead frame can stably connect the chip and the lead frame.

In some embodiments, the base is provided with an L-shaped supporting plate, the supporting plate is fixedly connected to the base, and the coil and the plurality of magnets are arranged on the supporting plate. Thus, the base can be configured for supporting and limiting for the driving mechanism.

In some embodiments, the wire clamping system further comprising a stopper located between the connecting plate and the base, and the stopper is configured for limiting a movement of the connecting plate of the wire clamping assembly along the Z-direction. Thereby, an impact force between the connecting plate and the base can be reduced.

In some embodiments, the stopper comprises a limiting block and a limiting seat couple to each other, wherein the limiting block is arranged at one end of the connecting plate, and the limiting seat is arranged on the base.

In some embodiments, the wire clamping assembly is pivotally connected to the wire clamping support with a pivot point.

In some embodiments, the elastic assembly comprises a spring, the base is provided with a support block, the connecting plate is provided with a first protrusion for connecting one end of the spring, and the support block is provided with a second protrusion for connecting the other end of the spring. Therefore, the connecting plate to switch can be limited.

In some embodiments, the one end of the connecting plate is provided with a sheet plate, and two ends of the sheet plate are respectively connected to the wire clamping support and the connecting plate; the driving mechanism comprises a piezoelectric motor and a link assembly, the link assembly is connected to the base and in contact with the connecting plate, the piezoelectric motor is in contact with the link assembly, the piezoelectric motor generating a thrust force on the link assembly to make the connecting plate move, resulting in the sheet plate elastically deforming to drive the wire clamping assembly to move toward the capillary.

In some embodiments, the link assembly is a four-bar linkage assembly, the four-bar linkage assembly comprises a first link, a second link, a third link and a fourth link, which are rotatably connected to each other in order; the first link is fixedly connected to the base; the piezoelectric motor, which is in contact with the second link, is configured for pushing the second link; the third link can move along the Z-direction under a driving force of the second link and the fourth link; the connecting plate is provided with a stopper portion, the third link is provided with a contacting rod, and the contacting rod can abut against the stopper portion and lift the connecting plate.

BRIEF DESCRIPTION OF THE DRAWINGS

For better description of embodiments and/or examples of the disclosures disclosed herein, one or more of the figures will be provided. Additional details or examples for describing the figures should not be considered limiting of the scope of any of the disclosed disclosures, presently described embodiments and/or examples, and presently best modes of these disclosures.

DETAILED DESCRIPTION

The present disclosure will be further described in detail below with reference to the drawings and specific embodiments, in order to better understand the present disclosure. However, the present disclosure may be implemented in many different forms and is not limited to the embodiments described herein. On the contrary, the purpose of providing these embodiments is to make the understanding of the disclosure of the present disclosure more thorough.

It should be noted that when an element is referred to as being "fixed" to another element, it may be directly attached to the other element or a further element may be presented between them. When an element is considered to be "connected" to another element, it may be directly connected to the other element or connected to the other element through a further element (e.g., indirectly connected).

Hereinafter, specific embodiments of the present disclosure are described with reference to drawings, but the present disclosure is not limited to these embodiments.

Embodiment 1

Figure 1:
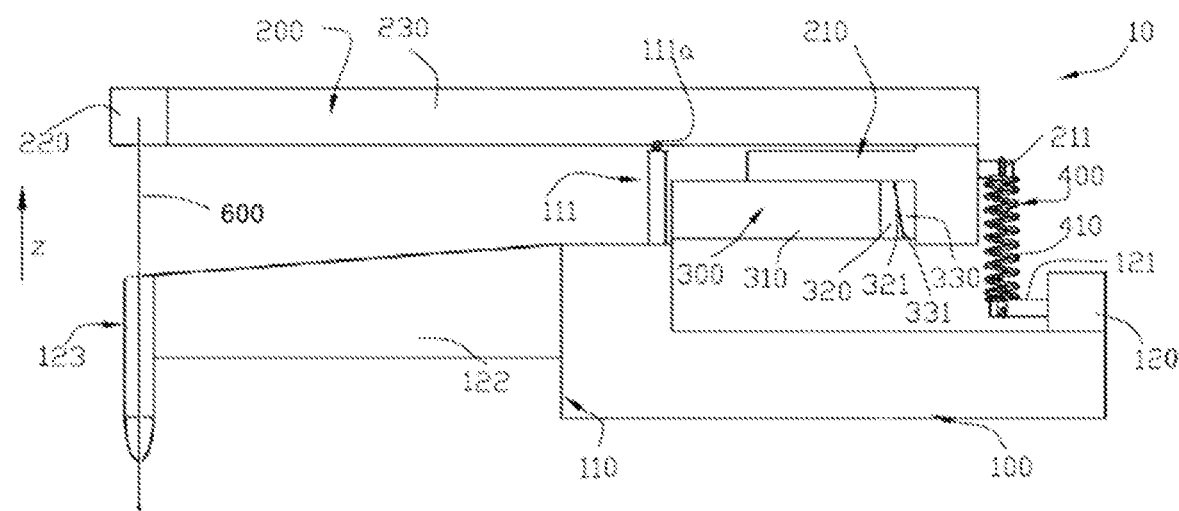
FIG. 1 is a cross-sectional view of a wire clamping system for a fully automatic wire bonding machine in a first embodiment of the present disclosure.

As shown in FIG. 1, a wire clamp system 10 for a fully automatic wire bonding machine is provided. Hereinafter, the wire clamping system 10 for the fully automatic wire bonding machine is simply referred to as the wire clamping system 10. The wire clamp system 10 can include a base 100, a wire clamping support 111, a wire clamping assembly 200, a driving mechanism 300 and an elastic assembly 400. The base 100 can move with a bonding head (not shown). It should be noted that, in the present disclosure, the driving mechanism 300 refers to a driving mechanism independent from other driving mechanisms in the fully automatic wire bonding machine.

In the present disclosure, a bond of the metal wire 600 and the chip is defined as a first bond, and a bond of the metal wire 600 and the lead frame lead frame is a second bond.

One end of the base 100 is provided with a wire clamping support 111. The wire clamping assembly 200 is pivotally connected to the wire clamping support 111. The base 100 is further provided with a driving mechanism 300 for driving the wire clamping assembly 200 to rotate. That is, the wire clamping assembly 200 can rotate relative to the wire clamping support 111 driven by the driving mechanism 300. An elastic assembly 400 configured for resetting the wire clamping assembly 200 is provided between one end of the base 100 away from the wire clamping support 111 and the wire clamping assembly 200.

The wire clamping support 111 can have a pivot point 111a. The wire clamping assembly 200 can be hinged to the wire clamping support 111 with the pivot point 111a. That is, the wire clamping assembly 200 can rotate relative to the wire clamping support 111 with the pivot point 111a.

The wire clamping assembly 200 can include a wire clamping and loosening element 220. The wire clamping and loosening element 220 can be located at one end of the wire clamping assembly 200 away from the elastic assembly 400. One end of the base 100 is provided with a capillary 123. The capillary 123 is capable of guiding and cutting off/thinning the metal wire 600. The capillary 123 is disposed opposite to the wire clamping and loosening element 220. Under driven by the driving mechanism 300, the wire clamping and loosening element 220 can move in the Z-direction toward the capillary 123. That is, the wire clamping and loosening element 220 can change a distance between the wire clamping and loosening element 220 and the capillary 123 along the Z-direction. Thus, an end of the metal wire 600 can be exposed out of an end of the capillary 123. It should be noted that, the distance between the wire clamping and loosening element 220 and the capillary 123 along the Z-direction is a height difference between the wire clamping and loosening element 220 and the capillary 123 along the Z-direction.

In a traditional wire clamping system for fully automatic wire bonding machine, there is no relative movement between a wire clamping assembly and a capillary. After the second bond is finished, the wire clamping and loosening element is in an open state, and the wire clamping assembly and the capillary will rise by a small distance together, and the metal wire will extend out of the capillary as the tail. In this process, the wire clamping and loosening element is in the opened state firstly, and then turned to the closed state after the tail is leaved. The capillary needs to touch and press the tail after the second bond, and connection strength between the tail and the second bond can neither be too strong nor too weak. The reason is that, if too strong, a firmness of the second bond is affected when the tail is pulled off, or the tail is not cut off at the position of the second bond. Because the metal wire has a tendency to retract, the metal wire at the end of the capillary will be pulled, vibrations will occur during the overall rising process of the wire clamping assembly and the capillary, and the metal wire on the second bond will be easily pulled off when the second bond and the metal wires is not totally welded together, resulting in that the metal wire may fly and needs to be re-threaded.

In the wire clamping system 10 of the present disclosure, when the welding of the second bond is completed, the wire clamping assembly 200 is in a clamping state. The capillary 123 cuts off the metal wire 600 located at the end of the capillary 123. The wire clamping and loosening element 220 of the wire clamping assembly 200 moves toward the capillary 123. Thus, the metal wire 600 located between the capillary 123 and the wire clamping and loosening element 220 enters into the capillary 123. Moreover, the metal wire 600 located inside the capillary 123 protrudes to the end of the capillary 123 as the tail. In this process, the wire clamping assembly 200 is in the clamping state, and there is litter pull force upon the metal wire 600 toward the second bond; and even though the fully automatic wire bonding machine vibrate, it will not affect the metal wire 600 when leaving the tail, so that the metal wire 600 toward the second bond will not separate away from the second bond earlier. Therefore, after the bonding of the second bond is completed, the scraping pressure of the capillary 123 on the tail may be large optionally, thereby ensuring the firmness of the second bond, and improving the working efficiency of the wire clamping system 10.

In use, the metal wire 600 on the wire clamping assembly 200 penetrates through the wire clamping and loosening element 220 and the capillary 123 subsequently. In the working process, after the second bond is completed, the wire clamping assembly 200 is in the clamping state, the capillary 123 touches the metal wire 600 and makes the metal wire 600 thinned. Then, the driving mechanism 300 is added with a certain voltage, the wire clamping assembly 200 rotates, thereby driving the wire clamping and loosening element 220 toward the capillary 123. When the wire clamping system 10 moves close to a firing rod (not shown), the tail located of the metal wire 600 will be burned into the ball. Then, the wire clamping assembly 200 is in the opened state, the applied voltage of the driving mechanism 300 is powered off, and the distance between the wire clamping and loosening element 220 and the capillary 123 is return due to the action of the elastic assembly 400. The wire clamping system 10 moves to the next first bond. The ball is bonded to the next first bond. Subsequently, the wire clamping system 10 can rise up as a whole. After a certain movement, the wire clamping assembly 200 will turn to the closed station. The wire clamping assembly 200 can move long the X-direction, Y-direction, and Z-direction, and an arc can be formed between the first bond and the second bond, in order to form a wire loop as electrical communication between the first bond and the second bond. Then bonding of the second bond is performed. When the second bond is completed, the wire clamping assembly 200 return to the clamping state. Such operations are repeated. The full automatic connection of the plurality of metal wires 600 between the chips and the lead frame is achieved. It should be explained that, the X-direction refers to a horizontal direction of the clamping system 10, i. e., an axial direction of the base 100, and the Y-direction refers to a direction perpendicular to the X-direction and Z-direction.

The wire clamping assembly 200 can include a wire clamping main body 230 and a connecting plate 210. The wire clamping and loosening element 220 can be located at one end of the wire clamping main body 230 away from the wire clamping support 111, and the connecting plate 210 can be fixedly connected to the wire clamping main body 230. That is, the wire clamping and loosening element 220 and the connecting plate 210 are located at two ends of the wire clamping main body 230.

The driving mechanism 300 can include a piezoelectric motor 310, a first wedge block 320 and a second wedge block 330. The piezoelectric motor 310 is located on the base 100. The first wedge block 320 and the second wedge block 330 are located between the wire clamping support 111 and the connecting plate 210. One end of the elastic assembly 400 is connected to the base 100, and the other end of the elastic assembly 400 is connected to the connecting plate 210.

A support block 120 is disposed on the base 100, and the support block 120 is configured for connecting the elastic assembly 400. By the arrangement of the elastic assembly 400, a certain preload is provided between the connecting plate 210 and the base 100, so as to avoid the wire clamping assembly 200 from shaking relative to the base 100 during using, that is, ensuring that the wire clamping system 10 can have a certain stiffness and quick response.

Specifically, the elastic assembly 400 can include a spring 410, the connecting plate 210 is provided with a first protrusion 211 for connecting one end of the spring 410, and the first protrusion 211 is fixedly connected to the connecting plate 210. The support block 120 is fixedly connected to the base 100, and further provided with a second protrusion 121 for connecting the other end of the spring 410. During the rotation of the wire clamping assembly 200 relative to the wire clamping support 111, one end of the connecting plate 210 is fixedly connected to the wire clamping assembly 200, the first protrusion 211 is fixedly connected to one end of the connecting plate 210 and the second protrusion 121 is fixedly connected to the support block 120, so elastic force is generated by the spring 410. When the driving mechanism 300 is powered off, the elastic force of the spring 410 can make the first protrusion 211, the connecting plate 210 and the wire clamping main body 230 to rotate reversely. That is, the spring 410 is returned, the first protrusion 211 will generate a pulling force toward the second protrusion 121. The wire clamping and closing end 220 will move in a direction away from the capillary 123. The clamping system 10 is thus automatically reset.

The first wedge block 320 and the second wedge block 330 can be disposed between one end of the connecting plate 210 and the piezoelectric motor 310. One end of the first wedge block 320 is in contact with the piezoelectric motor 310, and the other end of the first wedge block 320 is adjacent to one end of the second wedge block 330. The other surface of the second wedge block 330 is in contact with the connecting plate 210. The first wedge block 320 and the second wedge block 330 can reduce or eliminate the gap between the piezoelectric motor 310 and the connecting plate 210. When the piezoelectric motor 310 is powered on, a piezoelectric ceramic in the piezoelectric motor 310 expands under the effect of voltage, and drives the first wedge block 320 to move toward the second wedge block 330, resulting in that the second wedge block 330 moves along the Z-direction and the wire clamping assembly 200 rotates. During the reset process of the wire clamping assembly 200, the voltage of the piezoelectric motor 310 is continuously decreased, and the length thereof is continuously contracted. Then, the rotational displacement of the entire wire clamping system 10 is also continuously decreased, and the wire clamping assembly 200 and the connecting plate 210 are gradually reset by the elastic force of the spring 410.

Both the first wedge block 320 and the second wedge block 330 have a right trapezoid shape. The first wedge block 320 has a first inclined surface 321 and the second wedge block 330 has a second inclined surface 331. The first inclined surface 321 is opposite to the second inclined surface 331 and can be in contact with the second inclined surface 331. The first wedge block 320 can have a first edge and a second edge parallel to each other, and a length of the first edge is shorter than that of the second edge and the first edge is disposed close to the wire clamping assembly 200. That is, an upper edge of the first wedge block 320 is disposed close to the wire clamping assembly 200. In this way, the positions of the first wedge block 320 and the second wedge block 330 can be adjusted, so that the first wedge block 320 and the second wedge block 330 are fitted together, so that the extension displacement of the piezoelectric motor 310 can be accurately transmitted, and then the wire clamping and loosening element 220 can move in a direction close to the capillary 123, thereby the wire clamping assembly 200 rotating relative to the wire clamping support 111. Because both the first wedge block 320 and the second wedge block 330 have a right trapezoid shape, and a right angle side of the first wedge block 320 is fixedly connected to the piezoelectric motor 310, a right angle side of the second wedge block 330 is fixedly connected to the connecting plate 210, and the first wedge block 320 is contacted to the second wedge block 330, thereby avoiding interference or clearance due to processing error of each part/elements.

The capillary 123 can have a through hole (not shown) for the metal wire 600 penetrating. The metal wire 600 penetrates into the through hole from the wire clamping and loosening element 220, and protrudes out of the end of the capillary 123. The capillary 123 can cut off or thin the metal wire 600, thereby facilitating the metal wire 600 broken.

The wire clamping system 10 can further include a transducer seat 110. The transducer seat 110 is fixedly connected to the base 100. One end of the transducer seat 110 is provided with a transducer 122. The transducer 122 is located between the capillary 123 and the transducer seat 110. One end of the transducer 122 is fixedly connected to the transducer seat 110. The other end of the transducer 122 is fixedly connected to the capillary 123. The transducer 122 is configured for working on the part of the metal wire 600 located in the capillary 123, so that a second bond corresponding to the first bond can be formed on the lead frame.

Embodiment 2

Figure 2:
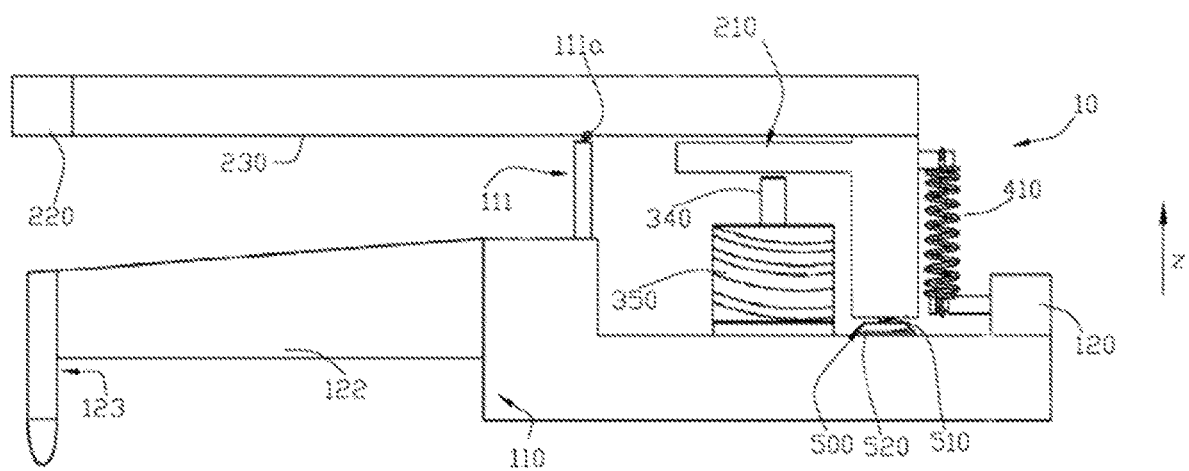
FIG. 2 is a cross-sectional view of a wire clamping system for a fully automatic wire bonding machine in a second embodiment of the present disclosure.

As shown in FIG. 2, another wire clamping system for a fully automatic wire bonding machine is further provided. The structure of the wire clamping system in the present embodiment is substantially the same as that of wire clamping system 10 in Embodiment 1, the difference is that the structure of the driving mechanism 300 and adding a stopper 500 between the connecting plate 210 and the base 100. The connecting plate 210 can be made of a metal material capable of being magnetically attracted or magnetically repulsed, such as iron, nickel, cobalt, etc.

In detail, the driving mechanism 300 can include an solenoid 340 disposed between the connecting plate 210 and the base 100. The solenoid 340 is wound with a stator 350. The stator 350 can generate a magnetic field. When the stator 350 is powered on, a magnetic force is generated around the solenoid 340. The magnetic force can push the connecting plate 210 to move. That is, the solenoid 340 can generate a thrust on the connecting plate 210. The wire clamping main body 230 can rotate relative to the wire clamping support 111, resulting in the wire clamping and loosening element 220 moving toward the capillary 123. When the stator 350 is powered off, the solenoid 340 will not generate the magnetic force, so that the connecting plate 210 and the wire clamping assembly 200 will only endure the elastic force of the spring 410, thereby realizing a reverse rotation of the wire clamping main body 230 until the wire clamping assembly 200 is totally reset.

The wire clamping system 10 can further include a stopper 500 between the connecting plate 210 and the base 100, so as to limit the connecting plate 210 and the base 100 moving along the Z-direction, thereby limiting the rotation angle between the connecting plate 210 and the base 100 and reducing the impact force between the base 100 and the connecting plate 210.

The stopper 500 can include a limiting block 510 and a limiting seat 520, the limiting block 510 is arranged at one end of the connecting plate 210, and the limiting seat 520 is arranged on the base 100. In the process of resetting the wire clamping assembly 200, the connecting plate 210 moves towards the base 100, and when the limiting table 520 abuts against the limiting block 510, the connecting plate 210 and the wire clamping main body 230 stop flipping, and the resetting of the connecting plate 210 and the wire clamping main body 230 completes, so as to avoid the connecting plate 210 and the wire clamping main body 230 from unduly flipping due to the elastic force of the spring 410. In other embodiments, the stopper 500 may also be limited by two limiting columns, or, one end of the connecting plate 210 can be provided with a limiting column, and the base 100 can be provided with a limiting slot couple to the limiting column.

Embodiment 3

Figure 3:
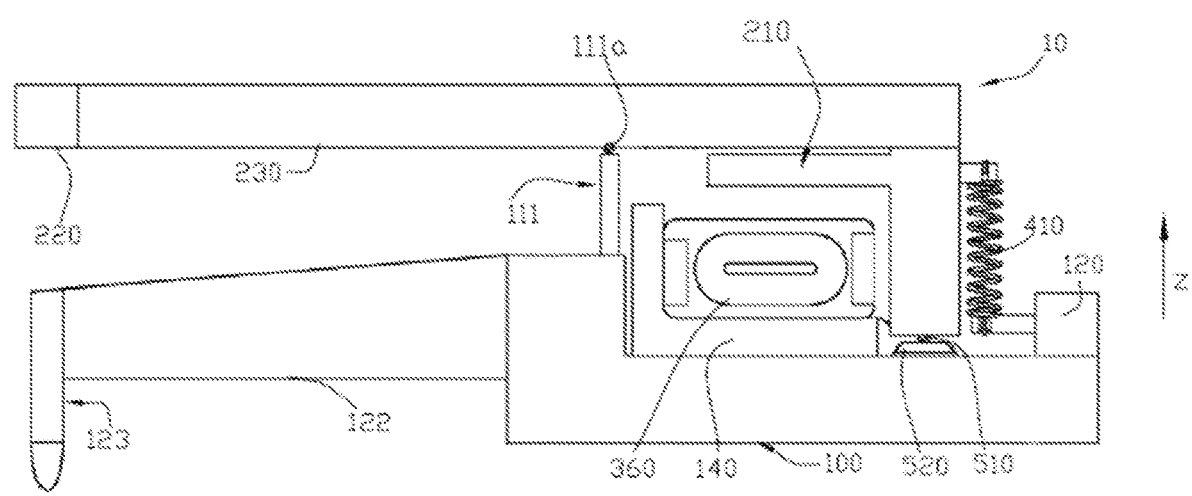
FIG. 3 is a cross-sectional view of a wire clamping system for a fully automatic wire bonding machine in a third embodiment of the present disclosure.
Figure 4:
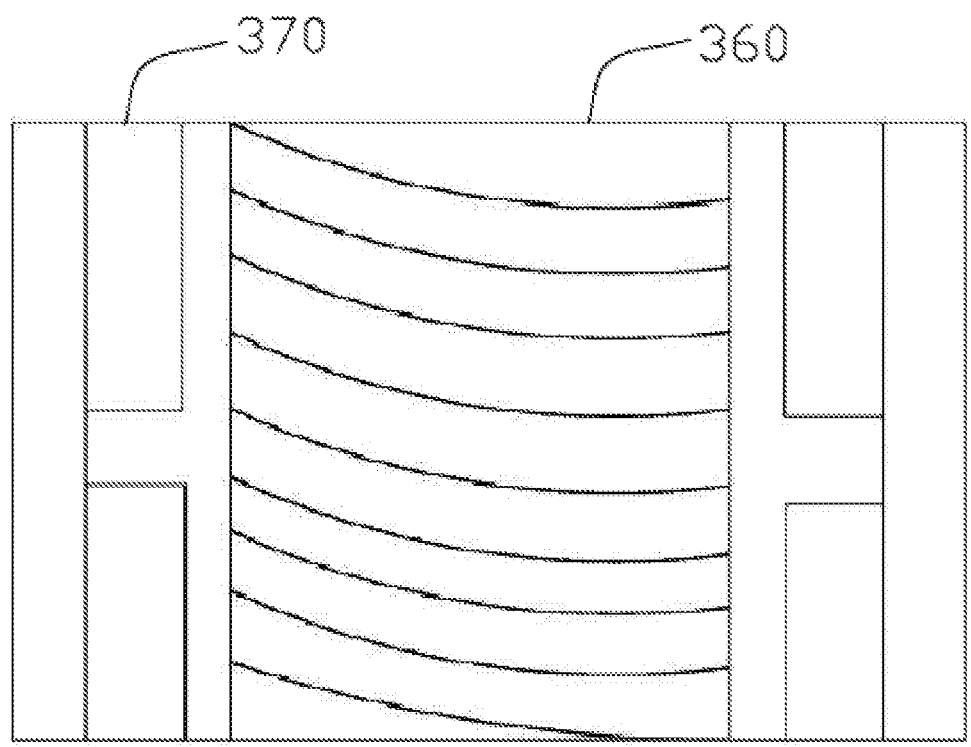
FIG. 4 is a cross-sectional view of a driving mechanism of the wire clamping system for the fully automatic wire bonding machine in FIG. 3.

As shown in FIGS. 3 and 4, another wire clamping system for a fully automatic wire bonding machine is further provided. The structure of the wire clamping system in the present embodiment is substantially the same as that of wire clamping system in Embodiment 2, the difference is that the structure of the driving mechanism 300. The connecting plate 210 can be made of a metal material capable of being magnetically attracted or magnetically repulsed, such as iron, nickel, cobalt, etc.

Specifically, the driving mechanism 300 can include a coil 360, and the outer periphery of the coil 360 is provided with a plurality of magnets 370. The base 100 is provided with a support plate 140 for supporting the driving mechanism 300. The cross section of the support plate 140 can be in an "L" shape and is fixedly connected to the base 100. The magnets 370 of the driving mechanism 300 are mounted on the support plate 140. The driving mechanism 300 abuts against a side wall of the support plate 140, and the coil 360 is fixed to the support plate 140. When the coil 360 is power on, the periphery of the coil 360 can generate a magnetic force, so that the magnetic force can generate a repulsive force for the connecting plate 210, that is, the wire clamping assembly 200 will rotate relative to the wire clamping support 111, so that the wire clamping and opening element 220 can move toward the capillary 123. When the coil 360 is powered off, the driving mechanism 300 will not generate the magnetic force, so that the connecting plate 210 and the wire clamping assembly 200 will only endure the elastic force of the spring 410, thereby realizing a reverse rotation of the wire clamping main body 230 until the wire clamping assembly 200 is totally reset.

Embodiment 4

Figure 5:
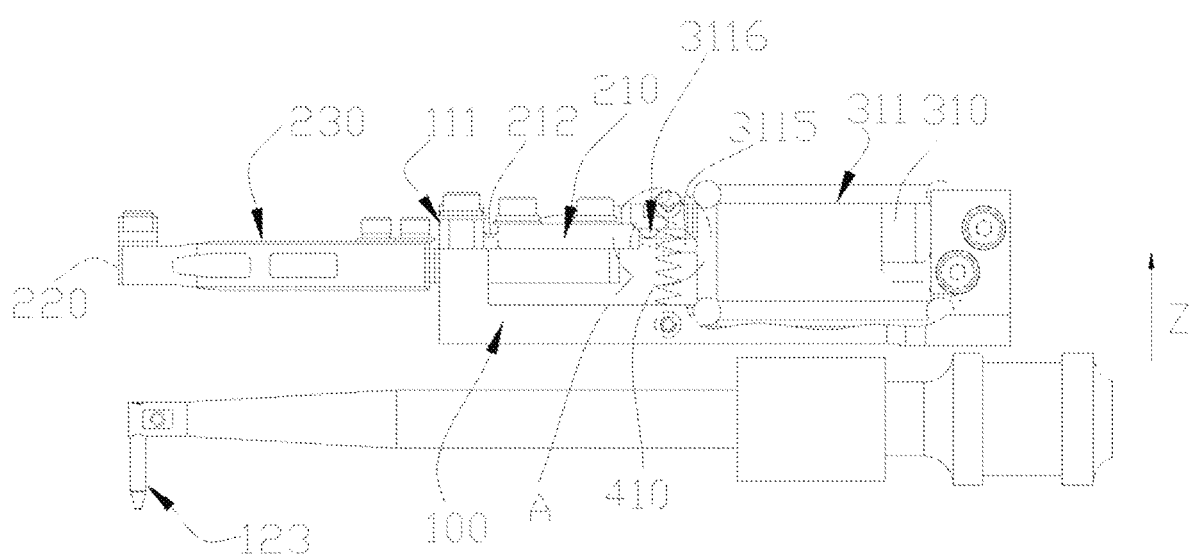
FIG. 5 is a cross-sectional view of a wire clamping system for a fully automatic wire bonding machine in a fourth embodiment of the present disclosure.
Figure 6:
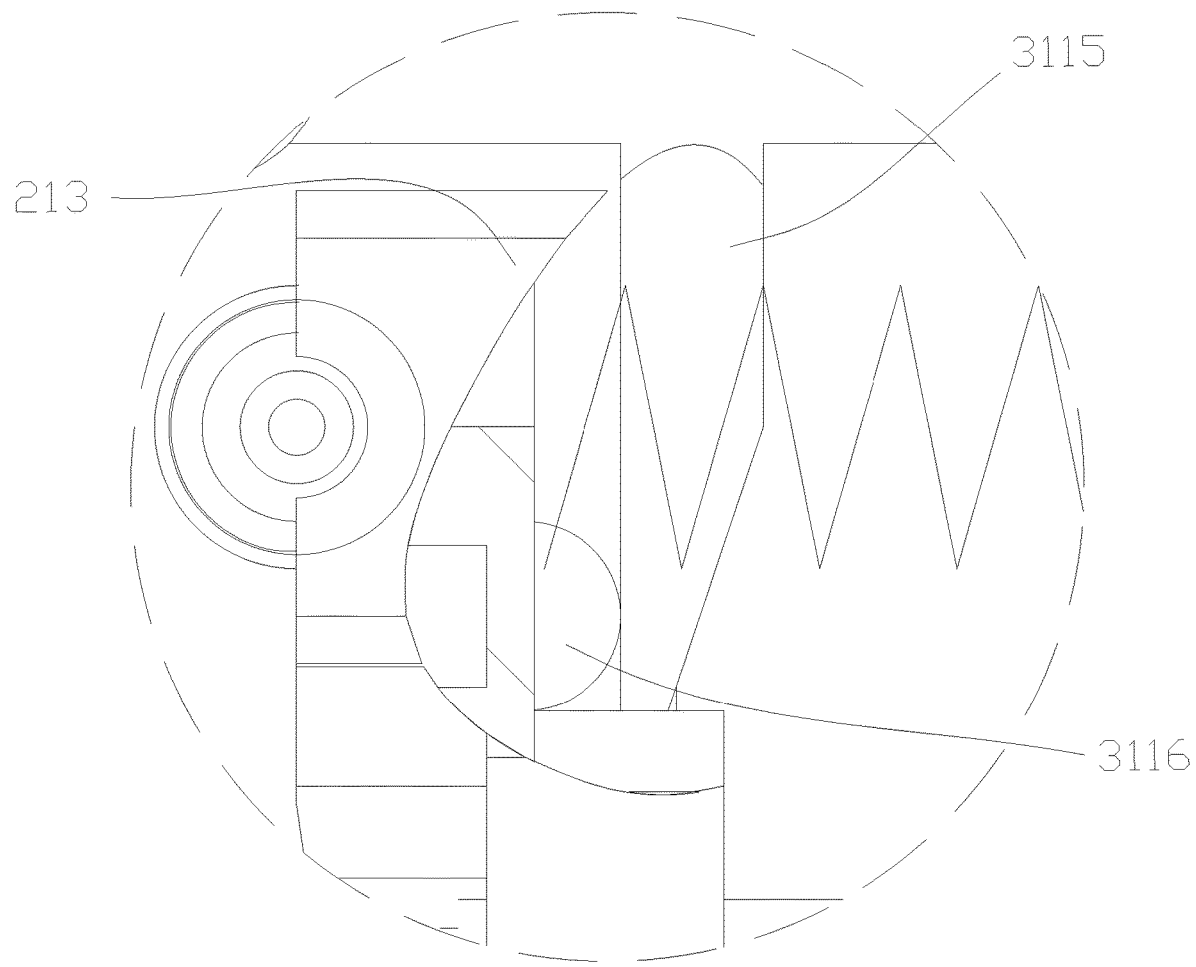
FIG. 6 is an enlarged view of portion A in FIG. 5.
Figure 7:
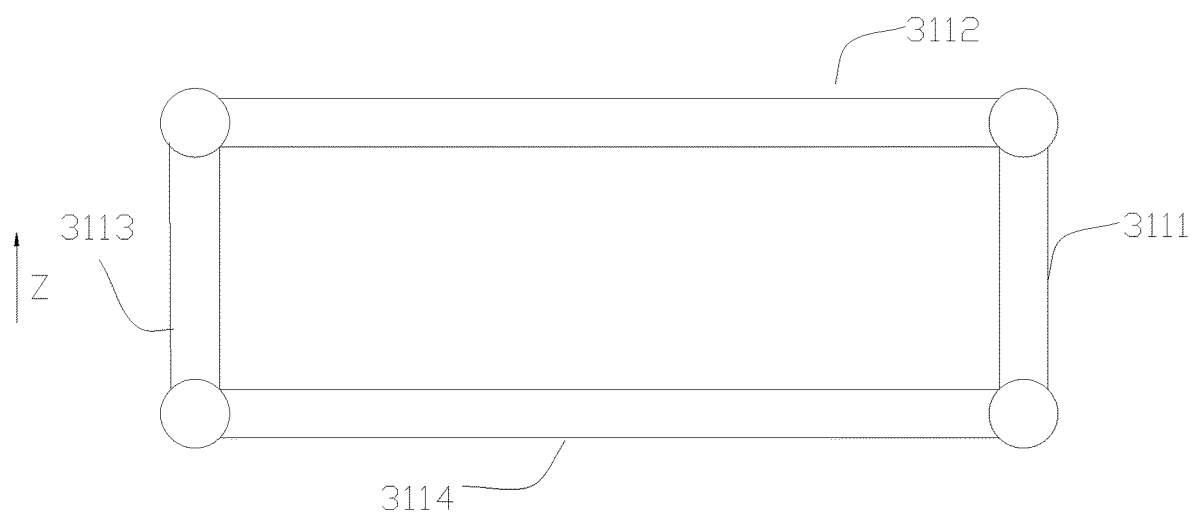
FIG. 7 is a cross-sectional view of a four-bar linkage assembly of the wire clamping system for the fully automatic wire bonding machine in the fourth embodiment.

As shown in FIG. 5 to FIG. 7, another wire clamping system for a fully automatic wire bonding machine is further provided. The structure of the wire clamping system in the present embodiment is substantially the same as that of wire clamping system in Embodiment 2, the difference is that the structure of the connecting plate 210 and the structure of the driving mechanism 300.

Specifically, the driving mechanism 300 comprises a piezoelectric motor 310 and a link assembly 311. The link assembly 311 can be connected to the base 100 and is in contact with the connecting plate 210. The piezoelectric motor 310 is in contact with the link assembly 311 and can generate an upward force on the connecting plate 210 through the link assembly 311. One end of the connecting plate 210 is provided with a sheet plate 212, and two ends of the sheet plate 212 are respectively connected to the wire clamping support 111 and the connecting plate 210. When the connecting plate 210 receives an upward force, the sheet plate 212 elastically deforms, and the wire holder body 230 rotates relative to the wire clamping support 111, so that the wire clamping and loosening element 220 will move toward the capillary 123. In the present embodiment, the capillary 123 is disposed opposite to the wire clamping and loosening element 220 and is disposed independently from the base 100.

The link assembly 311 is a four-bar linkage assembly, which includes a first link 3111, a second link 3112, a third link 3113 and a fourth link 3114 in order and rotatably connected to each other. The first link 3111 can be fixed to the base 100. The second link 3112 is arranged in parallel with the fourth link 3114. One end of the piezoelectric motor 310 is fixed to the base 100 and is fixedly connected to the first link 3111. The other end of the piezoelectric motor 310 is in contact with the second link 3112 and can push the second link 3112. The second link 3112 and the fourth link 3114 can swing up and down under the action of the piezoelectric motor 310. Under the action of the second link 3112 and the fourth link 3114, the third link 3113 can be movable along the Z-direction. The third link 3113 is provided with a contacting rod 3115, and the connecting plate 210 is provided with a stopper portion 213, and the contacting rod 3115 can abut against the stopper portion 213 and lift the connecting plate 210. In the present embodiment, the first link 3111, the second link 3112, the third link 3113, and the fourth link 3114 can form a parallelogram. Of course, in other embodiments, the first link 3111, the second link 3112, the third link 3113, and the fourth link 3114 can also form a trapezoid or other quadrangle, as long as the third link 3113 can move along the Z-direction under the action of the piezoelectric motor 310.

Furthermore, a spherical protrusion 3116 can be provided between the contacting rod 3115 and the stopper portion 213 to reduce a frictional force when the contacting rod 3115 and the stopper portion 213 abut against each other.

When the piezoelectric motor 310 is powered on, the piezoelectric ceramic in the piezoelectric motor 310 expands and push the second link 3112, so as to swing the second link 3112. Thus, the third link 3113 is driven to move upward. The contacting rod 3115 acts on the spherical protrusion 3116 to generate an upward thrust on the connecting plate 210. The sheet plate 212 is elastically deformed. The wire clamping main body 230 and the driving mechanism 300 are interlocked with each other by a contacting rod 3115. Thus, the clamp body 230 rotates. The wire clamping and loosening element 220 will move toward the capillary 123. It should be explained that, in the present embodiment, the wire clamping main body 230 is not fixedly connected to the base 100.

The elastic assembly 400 can include a spring 410. Two ends of the spring 410 are respectively connected to the connecting plate 210 and the base 100. When the voltage of the piezoelectric motor 310 is continuously decreased, the length thereof is continuously contracted, the rotational displacement of the whole wire clamping system 10 is also continuously decreased, and the wire clamping assembly 200 is gradually reset by the elastic force of the spring 410.

Specific embodiments described herein are merely illustrative of the spirit of the present disclosure. One skilled in the art to which the present disclosure pertains can make various modifications or supplementations to the specific embodiments described or replace in a similar manner without departing from the spirit of the present disclosure or beyond the scope defined in the appended claims.

We claim:

1. A wire clamping system for a fully automatic wire bonding machine, comprising:
   a base;
   a wire clamping support at an end of the base;
   a wire clamping assembly configured for clamping a metal wire and pivotally connected to the wire clamping support;
   a capillary capable of cutting off or thinning the metal wire;
   a driving mechanism configured for driving the wire clamping assembly to rotate independently, the wire clamping assembly comprises a wire clamping and loosening element arranged opposite to the capillary and configured for clamping and loosening the metal wire, a direction from the wire clamping and loosening element to the capillary is defined as a Z-direction, and the wire clamping assembly is rotatable relative to the base driven by the driving mechanism to change a distance between the wire clamping and loosening element and the capillary along the Z-direction, so that the metal wire, after cutting, extends outside of the capillary; and
   an elastic assembly configured for resetting the wire clamping assembly, wherein one end of the elastic assembly is connected to one end of the wire clamping assembly away from the wire clamping and loosening element, and another end of the elastic assembly is connected to another end of the base away from the wire clamping support, wherein
   the wire clamping assembly comprises a wire clamping main body and a connecting plate connected to the wire clamping main body, and the wire clamping and loosening element is located at one end of the wire clamping main body;
   the elastic assembly comprises a spring, the base is provided with a support block, the connecting plate is provided with a first protrusion for connecting one end of the spring, and the support block is provided with a second protrusion for connecting another end of the spring.

2. The wire clamping system of claim 1, wherein the driving mechanism comprises a piezoelectric motor, a first wedge block and a second wedge block, wherein the first wedge block and the second wedge block are disposed between the connecting plate and the piezoelectric motor, the first wedge block is fixedly connected to the piezoelectric motor, the second wedge block is fixedly connected to the connecting plate, and the first wedge block and the second wedge block can decrease or eliminate a gap between the piezoelectric motor and the connecting plate.

3. The wire clamping system of claim 2, wherein both the first wedge block and the second wedge block have a right-angle trapezoid shape, the first wedge block has a first inclined surface, the second wedge block has a second inclined surface,
   the first wedge block can move towards the second wedge block when driven by the piezoelectric motor, resulting in the first inclined surface being in contact with the second inclined surface,
   the first wedge block has a first edge and a second edge parallel to each other, a length of the first edge is shorter than that of the second edge and the first edge is disposed close to the wire clamping assembly.

4. The wire clamping system of claim 2, further comprising a transducer connected to the base by a transducer seat and the capillary is disposed on one end of the transducer away from the base.

5. The wire clamping system of claim 1, wherein the connecting plate is made of metal.

6. The wire clamping system of claim 5, wherein the driving mechanism comprises a solenoid and a stator, the stator is arranged on the base and around the solenoid, and the solenoid can drive the connecting plate to move, resulting in that the wire clamping assembly rotates relative to the base.

7. The wire clamping system of claim 5, wherein the driving mechanism comprises a coil, a plurality of magnets are located around an outer periphery of the coil, and the plurality of magnets can drive the connecting plate to move, resulting in that the wire clamping assembly rotates relative to the base.

8. The wire clamping system of claim 7, wherein the base is provided with an L-shaped supporting plate, the supporting plate is fixedly connected to the base, and the coil and the plurality of magnets are arranged on the supporting plate.

9. The wire clamping system of claim 1, further comprising a stopper located between the connecting plate and the base, and the stopper is configured for limiting a movement of the connecting plate of the wire clamping assembly along the Z-direction.

10. The wire clamping system of claim 9, wherein the stopper comprises a limiting block and a limiting seat couple to each other, the limiting block is arranged at one end of the connecting plate, and the limiting seat is arranged on the base.

11. The wire clamping system of claim 1, wherein the wire clamping assembly is pivotally connected to the wire clamping support with a pivot point.

12. The wire clamping system of claim 1, wherein one end of the connecting plate is provided with a sheet plate, and two ends of the sheet plate are respectively connected to the wire clamping support and the connecting plate;
   the driving mechanism comprises a piezoelectric motor and a link assembly, the link assembly is connected to the base and in contact with the connecting plate, the piezoelectric motor is in contact with the link assembly, the piezoelectric motor generating a thrust force on the link assembly to make the connecting plate move, resulting in the sheet plate elastically deforming to drive the wire clamping and loosening element to move toward the capillary.

13. The wire clamping system of claim 12, wherein the link assembly is a four-bar linkage assembly which comprises a first link, a second link, a third link and a fourth link which are rotatably connected to each other in order;

the first link is fixedly connected to the base;
the piezoelectric motor, which is in contact with the second link, is configured for pushing the second link;
the third link can move along the Z-direction under a driving force of the second link and the fourth link;

the connecting plate is provided with a stopper portion, the third link is provided with a contacting rod, and the contacting rod can abut against the stopper portion and lift the connecting plate.

* * * * *